United States Patent

Van Den Plassche

[15] 3,697,882

[45] Oct. 10, 1972

[54] AMPLIFIER CIRCUIT

[72] Inventor: Rudy Johan Van Den Plassche, Emmasingel, Eindhoven, Netherlands

[73] Assignee: U.S. Philips Corporation, New York, N.Y.

[22] Filed: Oct. 6, 1970

[21] Appl. No.: 78,378

[30] Foreign Application Priority Data

Oct. 13, 1969 Netherlands..............6915477

[52] U.S. Cl. ..........................330/15, 330/14, 330/26

[51] Int. Cl. ..................................................H03f 3/26

[58] Field of Search...................................330/14, 15

[56] References Cited

UNITED STATES PATENTS 3,469,202 9/1969 Priddy ..........................330/28

OTHER PUBLICATIONS

IBM Technical Dislosure Bulletin–Vol. 7, No. 3, August 1964 Page 202. " Preamplifier" by A. H. Wagner

*Primary Examiner*—Nathan Kaufman
*Attorney*—Frank R. Trifari

[57] ABSTRACT

An amplifier for converting a push-pull signal into a single-ended signal, using a transistor configuration having two input terminals, so that a loss-free conversion is obtained and at the same time both large common-mode signals and large output signals are permissible.

5 Claims, 2 Drawing Figures

PATENTED OCT 10 1972 3,697,882

INVENTOR.
RUDY J. VAN DEN PLASSCHE

BY

[signature]
AGENT.

AMPLIFIER CIRCUIT

The invention relates to an amplifier for converting a push-pull signal into a single-ended signal.

It is intended to be used in particular in integrated circuits in which not so much the number of transistors and diodes used as the number of resistors plays a part and in which inductances and transformers must entirely be avoided, whilst preferably no capacitors are used.

Push-pull signals are usually amplified by means of differential amplifiers. However, it may be desirable for the amplified difference signal to be converted into a single-ended signal. Thus, an operational amplifier generally has a difference input. However, as a rule a single-ended signal is desired at the output, so that the push-pull signal must be converted into a single-ended signal.

In known circuits this conversion usually is effected by using only one output signal of the differential amplifier for further processing. The second output of the differential amplifier then is connected to a point of constant potential, as the case may be through an impedance. Obviously, this manner of conversion gives rise to amplification loss and increased distortion, since only one of the outputs of the differential amplifier delivers a usueful signal and the signal at the second output is lost for the purpose of amplification.

In order to avoid the said amplification loss circuits have been devised in which a current inverter circuit is used. The common terminal of the converter circuit is connected to the supply source and its two input terminals are connected to the two outputs of the differential amplifier. Thus, the current through the inverter circuit is determined by the common-mode signal, whilst the complete difference signal can be taken from one of the outputs of the differential amplifier.

Obviously, in such circuits the tendency is to permit a maximum common-mode signal and a maximum output signal. In the known circuits using an inverter circuit in their collector circuits the two requirements cannot simultaneously be satisfied, for the voltage level of the output terminal depends upon the common-mode signal, so that a large common-mode signal does not leave much latitude for varying the output voltage. In order to maintain the voltage level as closely as possible midway between the voltages at the positive and the negative terminals of the voltage supply source an additional level shift is necessary which, however, introduces an additional time constant into the circuit. Moreover, this level shift is greatly dependent upon the supply voltage and is sensitive to temperature variations.

It is an object of the present invention to provide a particularly simple circuit for converting a push-pull signal into a single-ended signal, permitting the maximum common-mode signal and the maximum output signal to vary substantially up to the supply voltage, whilst no amplification loss appears.

The invention is characterized in that the push-pull signal currents are applied to the base and to the emitter respectively of a first transistor the emitter circuit of which includes a diode which shunts the emitter-base path of a second transistor the collector of which is connected to the base of the first transistor, the output signal current being taken from the collector of the first transistor.

It should be noted that a similar transistor configuration comprising two transistors and a diode is known for use as an inverter circuit.

The invention is based on the recognition that by using such an inverter circuit in the manner described as an addition circuit for the push-pull signals there will appear at the output the difference only, but not the common-mode component of the input signals.

Consequently, such a conversion of a push-pull signal into a single-ended signal does not give rise to amplification losses whilst the further advantages of the inverter circuit, such as its insensitivity to temperature fluctuations, are fully retained. Furthermore, the circuit may readily be modified so as to permit a maximum common-mode signal and at the same time a maximum output signal.

For this purpose a combination of two such circuits is used, the conductivity type of the transistors of one circuit being opposite to that of the transistors of the other circuit. Depending upon the conductivity type of the transistors of the preceding differential amplifier one of the circuits acts as an addition circuit, the other circuit supplying the current to the addition circuit and the differential amplifier. For this purpose the collectors of the corresponding transistors of the two circuits are interconnected.

The resulting circuit arrangement has the advantage that the voltage level at the output terminal of the addition circuit lies at a fixed value between the voltages at the positive and negative terminals of the voltage supply source, which value is not influenced by the common-mode component of the input signal. Further, the voltage level of the said output terminal is independent of supply voltage variations because, although the quiescent current adjustment of both the addition circuit and the circuit supplying the quiescent current is modified, this modification is equal for both circuits. By so choosing the voltage level of the output terminal as to be midway between the voltages at the positive and negative terminals of the voltage supply source the maximum permissible output signal will be substantially equal to the supply voltage. Finally, the voltage level at the input terminals of the addition circuit is equal, but for a few diode voltages, to the supply voltage, so that the maximum permissible common-mode signal also will be substantially equal to the supply voltage.

Embodiments of the invention will now be described, by way of example, with reference to the accompanying drawing, in which.

Figure 1:
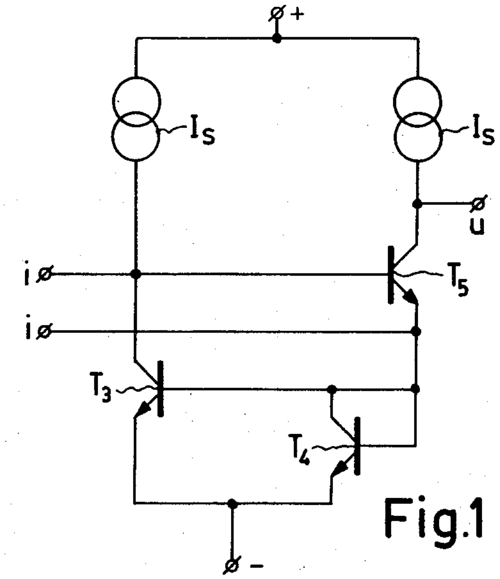
FIG. 1 is a circuit diagram of a circuit according to the invention.

FIG. 1 shows a circuit comprising transistors $T_3$ and $T_5$ and a transistor $T_4$ connected as a diode. The diode $T_4$ is included in the emitter circuit of the transistor $T_5$ and it shunts the base emitter path of the transistor $T_3$. The collector of the transistor $T_3$ is connected to the base of the transistor $T_5$. An essential requirement for satisfactory operation of the circuit is a satisfactory equality of the transistors, in particular in respect of the relationship between the base emitter voltage and the emitter current. Owing to the present-day manufacturing methods this requirement may readily be fulfilled.

According to the invention the input terminals *i* are formed by the base and the emitter of the transistor $T_5$, the output terminal *u* being constituted by the collector of this transistor. Current may be supplied to the circuit by means of two current sources $I_s$ which both have one terminal connected to the supply source whilst the other terminal is connected to the base and to the collector respectively of $T_5$.

The current flowing through $T_3$ is determined, but for the constant supply current, by the input current injected into the base of $T_5$. Since $T_3$ and $T_4$ perforce have the same base emitter voltage, the current flowing through $T_4$ is equal to that flowing through $T_3$. This current through $T_4$ is largely provided by the second input current supplied to the emitter of $T_5$. Consequently, the output current which may be taken from the collector of $T_5$ (output terminal *u*) is equal to the difference between the two input currents. If these input currents are the two push-pull currents from a differential amplifier, the output current will only comprise the difference signal.

The accuracy of the circuits is very high. Calculations show that the error in the output current due to the base currents of the transistors is reduced by a factor equal to the square of the current amplification factor of these transistors. Further, temperature variations exert substantially no influence on the behavior of the circuit, for the base emitter voltages of $T_3$ and $T_4$ will be equal irrespective of the temperature and hence their emitter currents will be equal, whilst variations of the base current of $T_5$ have substantially no influence on the output current because the influence of the base current as such is very small.

Thus, a particularly attractive and accurate conversion of a push-pull signal into a single-ended signal is obtained in which there is no longer any common-mode signal whilst the complete difference signal remains available.

Figure 2:
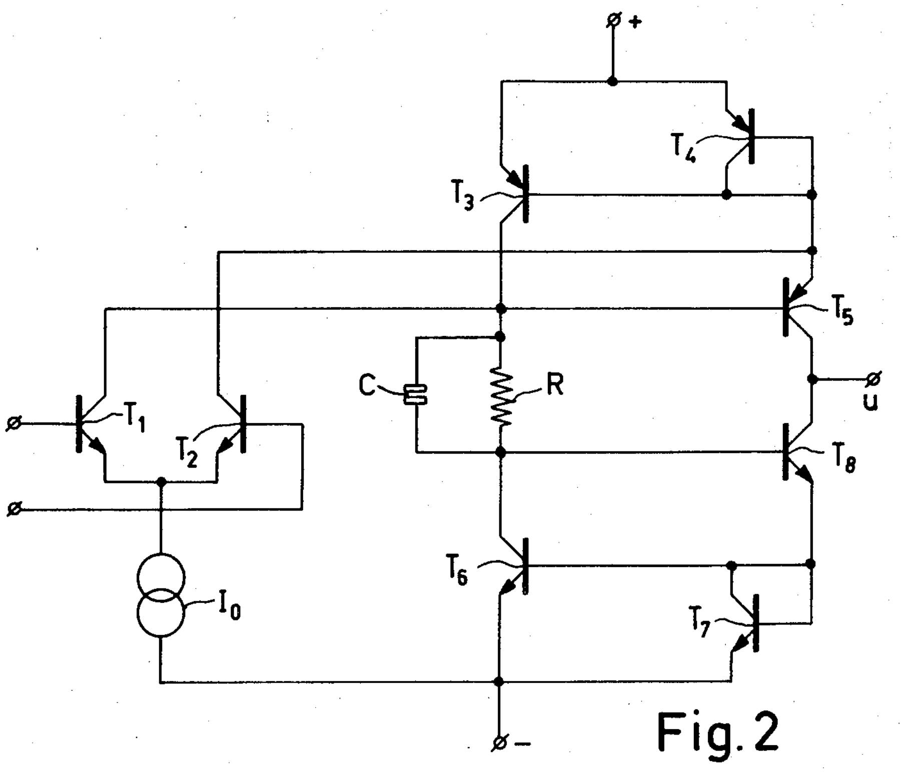
FIG. 2 is a circuit diagram of this circuit extended to include a differential amplifier.

The circuit is particularly suitable to be extended to form the circuit arrangement shown in FIG. 2. In this circuit arrangement the addition circuit comprises the transistors $T_3$ and $T_5$ and the transistor $T_4$ connected as a diode, which transistors now are of the pnp type. The push-pull signals are supplied by a differential amplifier comprising transistors $T_1$ and $T_2$ of the npn type the interconnected emitters of which are connected to the negative terminal of the supply source through a current source $I_0$. The collector of $T_5$, which is connected to the output terminal *u*, is connected to the collector of a transistor $T_8$ the emitter circuit of which includes a transistor $T_7$ which is connected as a diode and shunts the base emitter path of a transistor $T_6$ the collector of which is connected to the bases of $T_8$ and $T_5$. As the Figure clearly shows, the transistors $T_6$ and $T_8$ and the diode $T_7$ form a configuration equal to that formed by the transistors $T_3$ and $T_5$ and the diode $T_4$, however, the transistors of the latter configuration are of a type opposite to that of the transistors of the former configuration, and this circuit will now act as a current source.

The push-pull signals of the differential amplifier are converted by the addition circuit into a single-ended signal which may be taken from the output terminal *u*. The circuit is capable of handling very large common-mode signals, for the voltage at the outputs of the differential amplifier, i.e. at the collectors of the transistors $T_1$ and $T_2$, is equal, but for a few diode voltages, to the supply voltage. At the same time the circuit is suitable for large output signals, for the voltage level of the output terminal *u* may be chosen to lie midway between the positive and negative voltages of the supply source, the common-mode signal and any supply voltage variations having no influence on this voltage level. It is true that the common-mode signal and any variations of the supply voltage will bring about a variation of the quiescent currents of the addition circuit and of the current supply, but the two identical circuits undergo the same change.

In order to prevent a short circuit between the positive and negative terminals of the voltage supply source, a resistor R is included in the lead connecting the bases of $T_5$ and $T_8$. To improve the behavior of the circuit when pulse signals are applied to the input, the resistor R may be shunted by a capacitor C so that the resistor is short-circuited for high frequencies.

In order to permit integration of the circuit, the resistor may be replaced by the collector emitter path of a transistor to the base of which a constant quiescent current is supplied. In this case, the capacitor may shunt the base collector path of this transistor, with the consequent the advantage that the value of the capacitor may be small, enabling the capacitor to be readily integrated, for owing to the Miller effect the value of the capacitor will apparently be increased.

What is claimed is:

1. An amplifier for converting a push-pull signal into a single ended signal, comprising first and second transistors each having an emitter, a base and a collector, means for supplying input push-pull signal currents to the base and emitter respectively of a first of said transistors, a diode connected in the emitter path of said first transistor and connected in shunt with the emitter and base of said second transistor, means connecting the collector of said second transistor to the base of said first transistor, and means for deriving an output signal from the collector of said first transistor.

2. An amplifier as claimed in claim 1, further comprising a third and a fourth transistor, means connecting the collector and the base of the first transistor to the collector and the base respectively of the third transistor, a second diode connected in the emitter path of said third transistor and connected in the shunt with the base and emitter of said fourth transistor, means connecting the collector of said fourth transistor to the base of the third transistor, the third and fourth transistors and the associated diode being of a conductivity type opposite to that of the first and second transistors and of the diode associated therewith.

3. An amplifier as claimed in claim 2, further comprising a resistor interconnecting the base of the first transistor to the base of the third transistor.

4. An amplifier as claimed in claim 3, further comprising a capacitor in shunt with said resistor.

5. An amplifier as claimed in claim 3, wherein said resistor comprises the emitter collector path of a fifth transistor.

* * * * *